(12) United States Patent
Behrendt et al.

(10) Patent No.: US 12,133,366 B2
(45) Date of Patent: Oct. 29, 2024

(54) POWER ELECTRONICS MODULE WITH IMPROVED COOLING

(71) Applicant: Danfoss Silicon Power GmbH, Flensburg (DE)

(72) Inventors: Stefan Behrendt, Kiel (DE); Ronald Eisele, Surendorf (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 172 days.

(21) Appl. No.: 17/607,959

(22) PCT Filed: Apr. 30, 2020

(86) PCT No.: PCT/EP2020/062038
§ 371 (c)(1),
(2) Date: Nov. 1, 2021

(87) PCT Pub. No.: WO2020/221864
PCT Pub. Date: Nov. 5, 2020

(65) Prior Publication Data
US 2022/0295662 A1 Sep. 15, 2022

(30) Foreign Application Priority Data
May 2, 2019 (DE) .......................... 102019111367.9

(51) Int. Cl.
*H05K 7/20* (2006.01)
(52) U.S. Cl.
CPC ............. *H05K 7/205* (2013.01); *H05K 7/209* (2013.01)

(58) Field of Classification Search
CPC .............................. H05K 7/205; H05K 7/209
See application file for complete search history.

(56) References Cited

U.S. PATENT DOCUMENTS

| 4,069,497 A | 1/1978 | Steidlitz |
| 6,757,171 B2 * | 6/2004 | Bauer .................... H05K 7/205 361/705 |

(Continued)

FOREIGN PATENT DOCUMENTS

| CN | 101305460 A | 11/2008 |
| CN | 106340493 A | 1/2017 |

(Continued)

OTHER PUBLICATIONS

International Search Report for PCT/EP2020/062038 Dated Aug. 6, 2020.

*Primary Examiner* — Adrian S Wilson
(74) *Attorney, Agent, or Firm* — McCormick, Paulding & Huber PLLC

(57) ABSTRACT

The invention relates to a power electronics module including a flat circuit carrier (5) and an electronic assembly (10) arranged in an electrically contacting manner on the upper flat side of the circuit carrier (5) and cooling bodies (20) thermally in contact with the underside of the circuit carrier (5), wherein a heat-conducting bridge (30) arranged on the upper side of the circuit carrier (5), spanning the assembly (10) and extensively covering same, wherein the heat-conducting bridge (30) is in thermal contact with the cooling body (20) at mounting points arranged next to the assembly (10) and the space between the heat-conducting bridge (30) and the circuit carrier (5) is filled with a heat-conducting potting compound (50).

20 Claims, 2 Drawing Sheets

(56) References Cited

U.S. PATENT DOCUMENTS

| | | | | |
|---|---|---|---|---|
| 10,832,995 | B2* | 11/2020 | Eisele | .................. H01L 23/4334 |
| 11,400,514 | B2* | 8/2022 | Osterwald | .................. B22F 3/14 |
| 2003/0067754 | A1* | 4/2003 | Bauer | .................... H05K 7/205 |
| | | | | 361/760 |
| 2004/0089931 | A1 | 5/2004 | Nakajima et al. | |
| 2007/0268671 | A1* | 11/2007 | Brandenburg | ........ H01L 25/072 |
| | | | | 257/E25.012 |
| 2010/0038758 | A1 | 2/2010 | Stolze | |
| 2011/0304991 | A1* | 12/2011 | Huang | .................... H01L 23/13 |
| | | | | 977/734 |
| 2016/0157384 | A1 | 6/2016 | Liu et al. | |
| 2016/0260648 | A1* | 9/2016 | Eisele | .................. H01L 23/3735 |
| 2016/0352244 | A1 | 12/2016 | Cheng et al. | |
| 2017/0365541 | A1* | 12/2017 | Eisele | .................... H01L 23/291 |

FOREIGN PATENT DOCUMENTS

| | | |
|---|---|---|
| DE | 1514413 A1 | 6/1969 |
| DE | 602005000529 T2 | 11/2007 |
| DE | 10 2014 201 032 A1 | 7/2015 |
| DE | 10 2015 103 096 A1 | 9/2015 |
| DE | 102015221062 A1 | 5/2017 |
| DE | 10 2016 212 289 A1 | 1/2018 |
| DE | 102017119368 A1 | 3/2018 |
| DE | 102009002191 A1 | 10/2018 |
| EP | 1 858 077 A2 | 11/2007 |
| EP | 3066684 B1 | 10/2014 |
| GB | 1095387 A | 12/1967 |
| JP | 2006-313768 A | 11/2006 |

* cited by examiner a.

b.

POWER ELECTRONICS MODULE WITH IMPROVED COOLING

CROSS-REFERENCE TO RELATED APPLICATION

This application is a National Stage application of International Patent Application No. PCT/EP2020/062038, filed on Apr. 30, 2020, which claims priority to German Application No. 102019111367.9 filed on May 2, 2019, each of which is hereby incorporated by reference in its entirety.

TECHNICAL FIELD

The invention relates to a power electronics module with a planar circuit carrier and an electronic assembly arranged in an electrically contacted manner on the upper flat side of the circuit carrier and a cooling element thermally attached to the underside of the circuit carrier in a frictionally engaged and/or form-fitting manner, i.e. attached to the underside of the circuit carrier in a thermally conductive manner.

BACKGROUND

Power electronics assemblies comprise an assembly carrier, for example a circuit board, which is pre-structured for electrical interconnection and is populated with components designed for high currents. The assembly embodies the parts of a power electronics module through which current flows during operation. It therefore represents a heat source as a result of the ohmic power loss.

Other parts of the module serve inter alia for transporting away the generated heat by way of a contact surface to a heat sink, the primary heat sink usually being an air- or water-cooled cooling element. When there are high currents, and at the same time there is insufficient cooling, there is a risk of the assembly being destroyed.

Conventional circuit carriers are, for example, copper leadframes or organically or ceramically insulated printed circuit boards or assembly carriers, which have a conductive track structure. The components are electrically connected to the conductive tracks of the circuit carrier by pressed or materially connected contact elements, for example bonding wires or strips. Circuit carriers are either designed themselves to be heat-spreading, for example by a thick metallic layer on the underside, which is electrically insulated from the current-conducting conductors of the upper side by a dielectric coating, or they are formed ceramically with, typically thin, conductive tracks arranged on the upper side and are mounted on a separate metallic heat-spreading plate.

In the context of the present description, heat spreading always occurs on the underside of the circuit carrier, i.e. the circuit carrier may have an additionally mounted heat-spreading plate or else itself act in a heat-spreading manner. The underside of the circuit carrier is in thermal contact in a frictionally engaged and form-fitting manner with a primary heat sink. By contrast, the heat on the upper side of the circuit carrier is generated by ohmic losses in the assembly.

The assembly is usually embedded—or else potted—in an electrical insulation material, such as silicone gel or an electrically insulating epoxy resin, the insulation material often having a thermal insulation of just as high a value. Only the external connection contacts of a power electronics module remain exposed.

The heat is transported away from the assembly to the cooling element over two timeframes: pulsed outputs (<1 second) and continuous outputs (>>1 second). Pulsed outputs are too short to directly reach the heat sink and must be temporarily absorbed in the thermal mass of the insulation material in the vicinity of the assembly. By contrast, continuous outputs lead to a continuous heat flow of the power loss through all of the thermally conductive materials to the heat sink along the thermal gradient.

To improve the cooling, potting compounds that are good thermal conductors and at the same time are electrically insulating have already been proposed as insulation materials, for example an inorganic cement in DE 1 514 413 A1. Document EP 3 066 684 B1 likewise discloses a heat-conducting cement, in order to arrange a second cooling element in thermal contact on the surface thereof lying above an assembly on the populated side of the heat-spreading plate (see in particular FIGS. 3 and 4 of EP 3 066 684 B1).

The thermally conductive cement is very well suited for absorbing pulsed outputs. However, its thermal conductivity (also referred to from now on as heat conductance) lies in a range between 1 and 20 W/(m*K) and thus one to two orders of magnitude below the heat conductance of a conventional cooling element. In continuous operation, in spite of the two-sided cooling of the assembly, the power module from EP 3 066 684 B1 is heated very asymmetrically, because the majority of the generated heat is given off predominantly to the cooling element on the underside of the heat-spreading plate. The second cooling element on the surface of the potting compound therefore for the most part fails to work effectively.

Power modules available on the market have in any case a one-sided, planar heat-spreading plate, by way of which heat is also transported away to the primary heat sink, an air- or water-cooled cooling element, only on one side. This is an internationally conventional construction and has standard mounting sizes of the heat-spreading plates on one side and board mounting features (through-hole mounting pins) on the other side, which would require considerable cost and space to modify.

SUMMARY

The object of the invention is therefore to improve the efficiency of the one-sided cooling of an unchanged mounting and cooling arrangement.

This object is achieved by the power electronics module with the features of claim 1. The subclaims provide advantageous refinements.

The invention is based on the finding that, although the already mentioned heat-conducting cement as a potting compound offers a sufficient thermal mass for the absorption of pulsed output, in the case of continuous output the heat transport through the cement is not sufficient to cool those regions of the assembly that are relatively far away from the circuit carrier because of the overall height of the components. The heat generated there needs shorter transporting paths through the cement than are offered at present by the prior art in order to be transported away quickly.

These shorter heat paths can be achieved according to the invention by a heat-conducting bridge with very good heat conduction being arranged close to—but not in direct contact with—the component regions that are far away from the circuit carrier. The heat-conducting bridge is in this case formed as a structure which spans and extensively covers the assembly and is made of a material that has a very much higher heat conductance than the cement or the heat-conducting potting compound. The heat-conducting bridge preferably consists of a metal, for example of copper or aluminum, preferably a metal sheet, particularly preferably of copper or aluminum. At least at mounting points intended for it, it is in thermal contact with the cooling element, i.e. it can give off directly to the cooling element the heat which the heat-conducting bridge conductively brings from the upper side of the assembly. For example and preferably, the heat-conducting bridge is mounted by means of suitable mounting means, preferably by means of pins or screws, the mounting means particularly preferably protruding into the cooling element and thermally connecting the cooling element to the heat-conducting bridge. The mounting means are in particular metallic and can particularly preferably be led either past the circuit carrier or adjacent to it through an assembly. In particular, not only the heat-conducting bridge but also the circuit carrier is fastened to the cooling element by the mounting means. The heat-conducting bridge, mounting means and cooling element are especially electrically insulated completely from the assembly and are at an electrically neutral potential. The space between the heat-conducting bridge and the circuit carrier is filled with the heat-conducting potting compound, embedding the assembly in the potting compound. This provides the possibility of comparatively good thermal connection of the assembly on the underside to the circuit carrier and on the upper side to the heat-conducting bridge, which both give off the heat to the cooling element.

To be considered as a particularly advantageous refinement of the invention is that the heat-conducting bridge may be additionally provided with at least one projection on its side facing the assembly. Such a projection can shorten the heat paths through the potting compound still further if the projection position and projection height are suitably predetermined and the at least one projection is formed from a material that has at least the heat conductance of the material of the heat-conducting bridge.

For example, it is specifically of advantage if the projection position of the at least one projection is directly predetermined by a component of the assembly, the projection height being set in dependence on the overall height of the component so as to avoid contact. In this case, the projection protrudes out of the heat-conducting bridge up to as close as possible to the upper side of a component, so that the heat generated in the component only has to cross a short path through the potting compound before it enters the projection of the heat-conducting bridge of very good thermal conduction to be further transported away. In this case, it is necessary for safety reasons that a minimum layer thickness of the potting compound always remains between the projection and the component for electrical insulation. It can be precisely determined from the already known architecture of the assembly and the already known properties of the potting compound which projection positions and projection heights are to be predetermined on the heat-conducting bridge. In an extreme case, a heat-conducting bridge may have a plurality of projections which are arranged at various positions with various heights in such a way that they approximately replicate the profile of the overall height of the assembly—as a negative. In this case, each surface region of the assembly would be at approximately the same distance from the heat-conducting bridge—and therefore have the same heat path through the potting compound.

Furthermore, it may be specifically advantageous that the projection position of the at least one projection is predetermined independently of the assembly, the projection height being set such that the projection thermally contacts the circuit carrier. In this variant, the projection runs completely past the assembly directly to the circuit carrier, which in turn can give off heat to the cooling element. The at least one projection then represents a shortcut for the heat transport, which would otherwise predominately take place by way of the mounting means. Such shortcuts are particularly preferred if the heat-conducting bridge is formed over a great extent and for example spans and extensively covers a plurality of assemblies that are arranged adjacently though electrically separated from one another. The mounting points of the heat-conducting bridge may in this case lie at the edge of the power module, and a projection predetermined as a shortcut in the inner region of the module speeds up the heat transport to the primary heat sink. In this case, it is also possible that an intermediate space exists between the circuit carriers of the assemblies, providing free access to a commonly used cooling element or a heat-spreading plate. Then, the at least one projection may also have such a position and height that it thermally contacts the cooling element or the heat-spreading plate directly from the heat-conducting bridge.

The heat-conducting bridge according to the invention may have a number of projections which perform different functions of those described above, i.e. different variants can be realized simultaneously.

It is considered to be advantageous that the heat conductance of the potting compound is at least 3 W/(m*K). By contrast, the heat conductance of the material of the heat-conducting bridge should preferably be at least 20 times the heat conductance of the potting compound.

BRIEF DESCRIPTION OF THE DRAWINGS

The invention is to be illustrated below on the basis of figures, in which.

DETAILED DESCRIPTION

Figure 1:
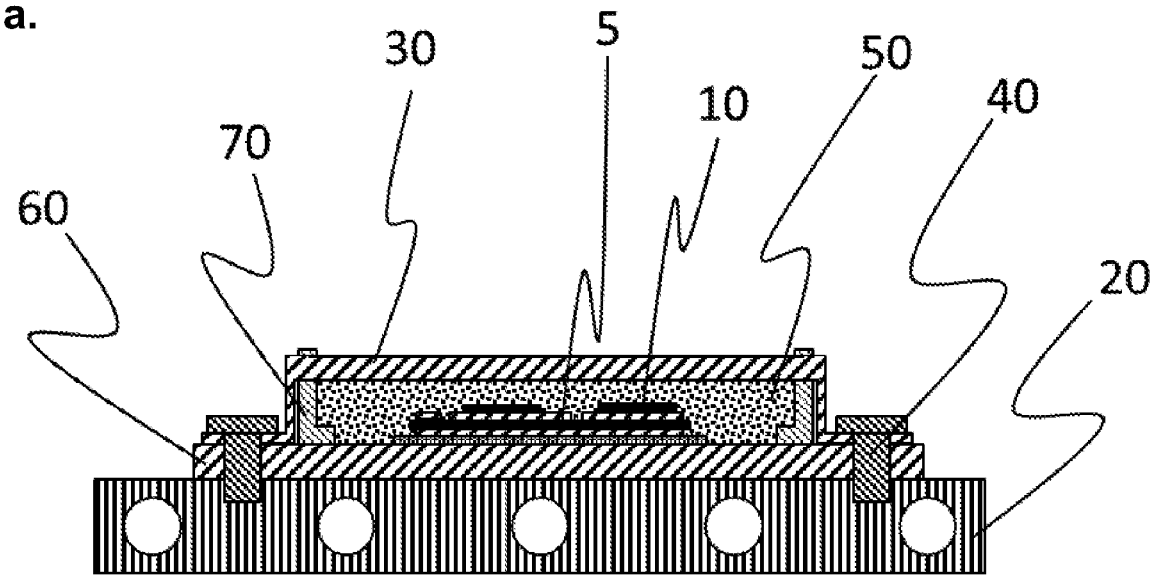
FIG. 1 (a) shows the diagram of a power module with a first heat-conducting bridge and (b) shows the diagram of a power module with a second heat-conducting bridge, which has projections as shortcuts for the heat transport.
Figure 1:
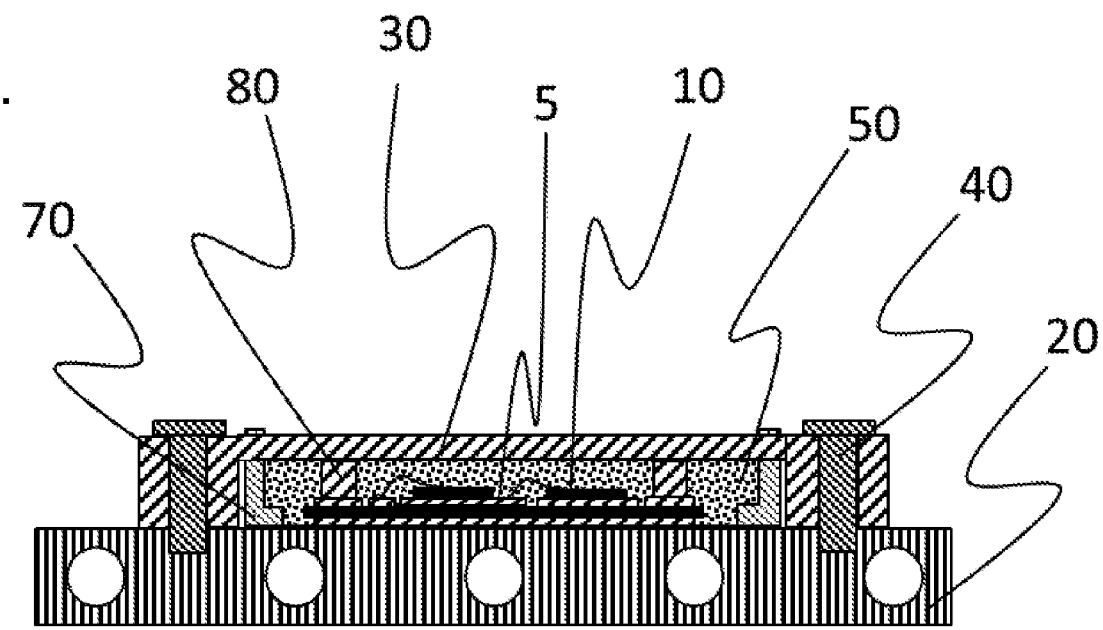

In FIG. 1a, a power electronics module is schematically shown as an exemplary embodiment, consisting of a circuit carrier 5 with a power assembly 10, which is mounted on a heat-spreading plate 60. The heat-spreading plate 60 is in turn fastened on a cooling element 20 by means of mounting means 40 (for example screws or pins). A peripheral plastic frame 70 delimits the potting compound with respect to the edge of the module and serves at the same time for mechanical stiffening. The mounting means 40 also clamp the heat-conducting bridge 30 over the assembly 10 to the lower heat-spreading plate 60 and at the same time to the cooling element 20, into which the mounting means 40 protrude. The heat-conducting potting compound 50 is in this case the thermal connection between the power-loss-affected surfaces of the power components, the contacting surfaces, including wires, strips and clips, and the conductive track surfaces of the power assembly 10 and the heat-conducting bridge 30. The potting compound 50 preferably fills the entire space between the heat-conducting bridge 30 and the circuit carrier 5 or heat-spreading plate 60. In this way, the mounting means 40 also generates a mounting pressure, which provides optimum surface pressing.

FIG. 1b shows as a variant of FIG. 1a) firstly a power module consisting of a circuit carrier 5 with a power assembly 10, which is mounted directly on the main cooling element 20. In the case of this type of construction, the ceramic or organic circuit carrier 5 is directly in thermal contact with the cooling element 20. The heat-conducting bridge 30 is in thermal contact with the potting compound 50 and leads the heat flow to internal conductive connections 80, which protrude as projections 80 out of the heat-conducting bridge 30 and press on surfaces of the circuit carrier adjacent to the assembly 10. The mounting pressure is exerted by the mounting means 40, which here, too, are designed such that they transport heat from the heat-conducting bridge 30 directly into the cooling element 20. Here, too, the plastic frame 70 is optional and advantageous.

The heat-conducting bridge 30 preferably consists of materials with high heat conduction such as copper or copper alloys or aluminum or aluminum alloys.

Figure 2:
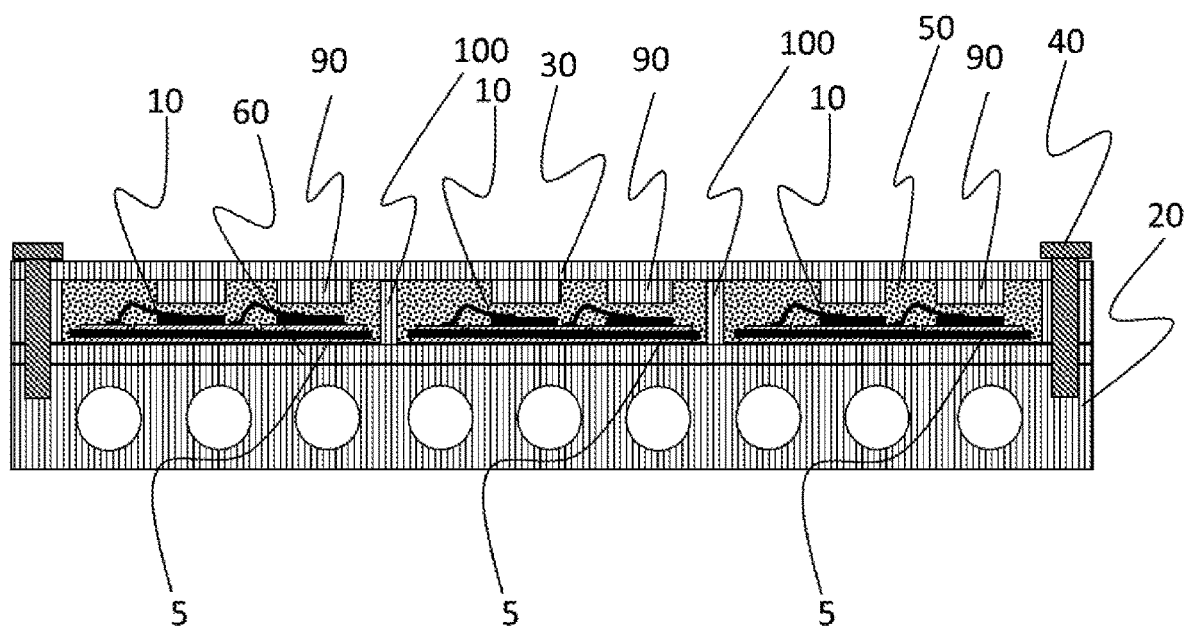
FIG. 2 shows the diagram of a power module with three assemblies spanned and extensively covered by a common heat-conducting bridge with projections of various functions.

FIG. 2 shows as a third exemplary embodiment a power electronics module consisting of three circuit carriers 5 with assemblies 10, which are mounted together on a heat-spreading plate 60 adjacently though electrically separated from one another, in particular spaced apart from one another. The heat-spreading plate 60 is in turn fastened on a cooling element 20 by means of mounting means 40. The mounting means 40 clamp the heat-conducting bridge 30 over all three assemblies 10 to the heat-spreading plate 60 and at the same time to the cooling element 20, into which the mounting means 40 protrude. In addition, the heat-conducting bridge 30 is thermally contacted directly with the lower heat-spreading plate 60 by way of internal conductive connections 100, which protrude as projections out of the heat-conducting bridge 30, through the potting compound 50. The contact surfaces of the projections 100 are expressly arranged next to or between the power-electronic circuit carriers 5 with the assemblies 10. The projections 100 consist here for example of the same material as the heat-conducting bridge 30.

It is evident that the power-loss heat dissipation can still be additionally improved, by further projections 90 of the thermal bridge 30 being arranged directly over the assemblies 10 in such a way that the heat bridge 30 with projections 90 follows in its contour the profile of the overall height of the assembly 10, i.e. that the undersides of the projections 90 are at a largely constantly predetermined distance above the semiconductors and bonding wires of the assembly 10. In this case, it should be particularly noted that the respective projection height above a component is set in dependence on the overall height of the component so as to avoid electrical contact. This is technically easy to achieve, for example by a contour-defined bridge plate or by additionally fastened thickening elements 90.

Experimental trials of the cooling with an arrangement of the kind from FIG. 1 show that, with a heat-conducting potting compound (inorganic cement) with a heat conductance of 5 W/(m*K) and a heat-conducting bridge according to the invention of aluminum with a heat conductance of 180 W/(m*K), the temperature of the semiconductor assembly when there is continuous output can be lowered by about 10° C.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power electronics module having a planar circuit carrier and an electronic assembly arranged in an electrically contacted manner on the upper flat side of the circuit carrier and a cooling element thermally contacted with the underside of the circuit carrier,
wherein
a heat-conducting bridge arranged on the upper side of the circuit carrier, spanning and extensively covering the assembly, the heat-conducting bridge being thermally contacted with the cooling element at mounting points arranged adjacent to the assembly, and the space between the heat-conducting bridge and the circuit carrier being filled with heat-conducting potting compound.

2. The power electronics module as claimed in claim 1, wherein the cooling element is thermally contacted in a frictionally engaged and/or form-fitting manner with the underside of the circuit carrier.

3. The power electronics module as claimed in claim 1, wherein the heat-conducting bridge is formed from metal.

4. The power electronics module as claimed in claim 1, wherein the heat-conducting bridge is formed from a metal sheet.

5. The power electronics module as claimed in claim 1, wherein the assembly is embedded in the heat-conducting potting compound.

6. The power electronics module as claimed in claim 1, wherein the heat-conducting bridge is mounted at the mounting points by means of mounting means, the mounting means protruding into the cooling element and thermally contacting the cooling element.

7. The power electronics module as claimed in claim 6, wherein the mounting means are pins or screws.

8. The power electronics module as claimed in claim 7, wherein the pins or screws are metallic pins or screws.

9. The power electronics module as claimed in claim 1, wherein the heat-conducting bridge in the mounted state has on its side facing the assembly at least one projection with a predetermined projection position and projection height, which is formed from a material that has at least the heat conductance of the material of the heat-conducting bridge.

10. The power electronics module as claimed in claim 9, wherein the projection position of the at least one projection is predetermined by a component of the assembly, the projection height being set in dependence on the overall height of the component so as to avoid electrical contact.

11. The power electronics module as claimed in claim 9, wherein the projection position of the at least one projection is predetermined independently of the assembly, the projection height being set such that the projection thermally contacts the circuit carrier.

12. The power electronics module as claimed in claim 1, wherein the heat conductance of the potting compound is at least 3 W/(m*K).

13. The power electronics module as claimed in claim 1, wherein the heat conductance of the material of the heat-conducting bridge is at least 20 times the heat conductance of the potting compound.

14. The power electronics module as claimed in claim 1, wherein an individual heat-conducting bridge spans and extensively covers a plurality of assemblies that are arranged adjacently though electrically separated from one another.

15. The power electronics module as claimed in claim 2, wherein the heat-conducting bridge is formed from metal.

16. The power electronics module as claimed in claim 2, wherein the heat-conducting bridge is formed from a metal sheet.

17. The power electronics module as claimed in claim 3, wherein the heat-conducting bridge is formed from a metal sheet.

18. The power electronics module as claimed in claim 2, wherein the assembly is embedded in the heat-conducting potting compound.

19. The power electronics module as claimed in claim 3, wherein the assembly is embedded in the heat-conducting potting compound.

20. The power electronics module as claimed in claim 4, wherein the assembly is embedded in the heat-conducting potting compound.

\* \* \* \* \*